(12) United States Patent
Aggarwal et al.

(10) Patent No.: US 7,968,878 B2
(45) Date of Patent: Jun. 28, 2011

(54) ELECTRICAL TEST STRUCTURE TO DETECT STRESS INDUCED DEFECTS USING DIODES

(75) Inventors: Rajni J. Aggarwal, Garland, TX (US); YuGuo Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 176 days.

(21) Appl. No.: 12/537,685

(22) Filed: Aug. 7, 2009

(65) Prior Publication Data
US 2010/0032670 A1 Feb. 11, 2010

Related U.S. Application Data

(60) Provisional application No. 61/086,911, filed on Aug. 7, 2008.

(51) Int. Cl.
H01L 29/10 (2006.01)
H01L 21/66 (2006.01)

(52) U.S. Cl. .................. 257/48; 257/E21.521; 438/17

(58) Field of Classification Search .............. 257/48, 257/213, 288, 355–363, 367, 368, 401, E21.521–E21.531; 438/14–18
See application file for complete search history.

(56) References Cited

U.S. PATENT DOCUMENTS 6,762,918 B2 * 7/2004 Voldman .................. 361/91.1
* cited by examiner

*Primary Examiner* — Minh-Loan T Tran
*Assistant Examiner* — Kevin Quinto
(74) *Attorney, Agent, or Firm* — Jacqueline J. Garner; Wade J. Brady, III; Frederick J. Telecky, Jr.

(57) ABSTRACT

A serpentine double gated diode array for monitoring stress induced defects is disclosed. The diode array is configured with adjacent gate segments and gate loops in close proximity to active areas to maximize a sensitivity to stress induced defects. The diode array is compatible with conventional electrical testing. Scanning capacitance microscopy (SCM) and scanning spreading resistance microscopy (SSRM) may be used to isolate individual stress induced defects. Variations in the gate configuration allow estimation of effects of circuit layout on formation of stress induced defects.

19 Claims, 10 Drawing Sheets

US 7,968,878 B2

ELECTRICAL TEST STRUCTURE TO DETECT STRESS INDUCED DEFECTS USING DIODES

FIELD OF THE INVENTION

This invention relates to the field of integrated circuits. More particularly, this invention relates to methods to reduce stress related defects in integrated circuits.

BACKGROUND OF THE INVENTION

It is common to induce horizontal tensile stress in n-channel metal oxide semiconductor (NMOS) transistors in integrated circuits (ICs) in order to improve on-state drive current and off-state leakage current. Processes such as stress memorization techniques and inclusion of tensile stress pre-metal dielectric liners frequently result in tensile stress levels above 1000 MPa. NMOS transistors are susceptible to stress induced defects which cause excess leakage current. Stress induced defects are sensitive to variations in active area and gate configurations. Detection and isolation of stress induced defects is problematic, because stress induced defects have little or no visibly observable signature and typically require analysis by transmission electron microscopy (TEM) for confirmation.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a serpentine double gated diode array configured to maximize a sensitivity to stress induced defects that may be electrically tested to estimate a density of stress induced defects and which is compatible with scanning capacitance microscopy (SCM) and scanning spreading resistance microscopy (SSRM) for isolation of instances of stress induced defects. Variations in the gate configuration allow estimation of effects of circuit layout on formation of stress induced defects.

DETAILED DESCRIPTION

Figure 1:
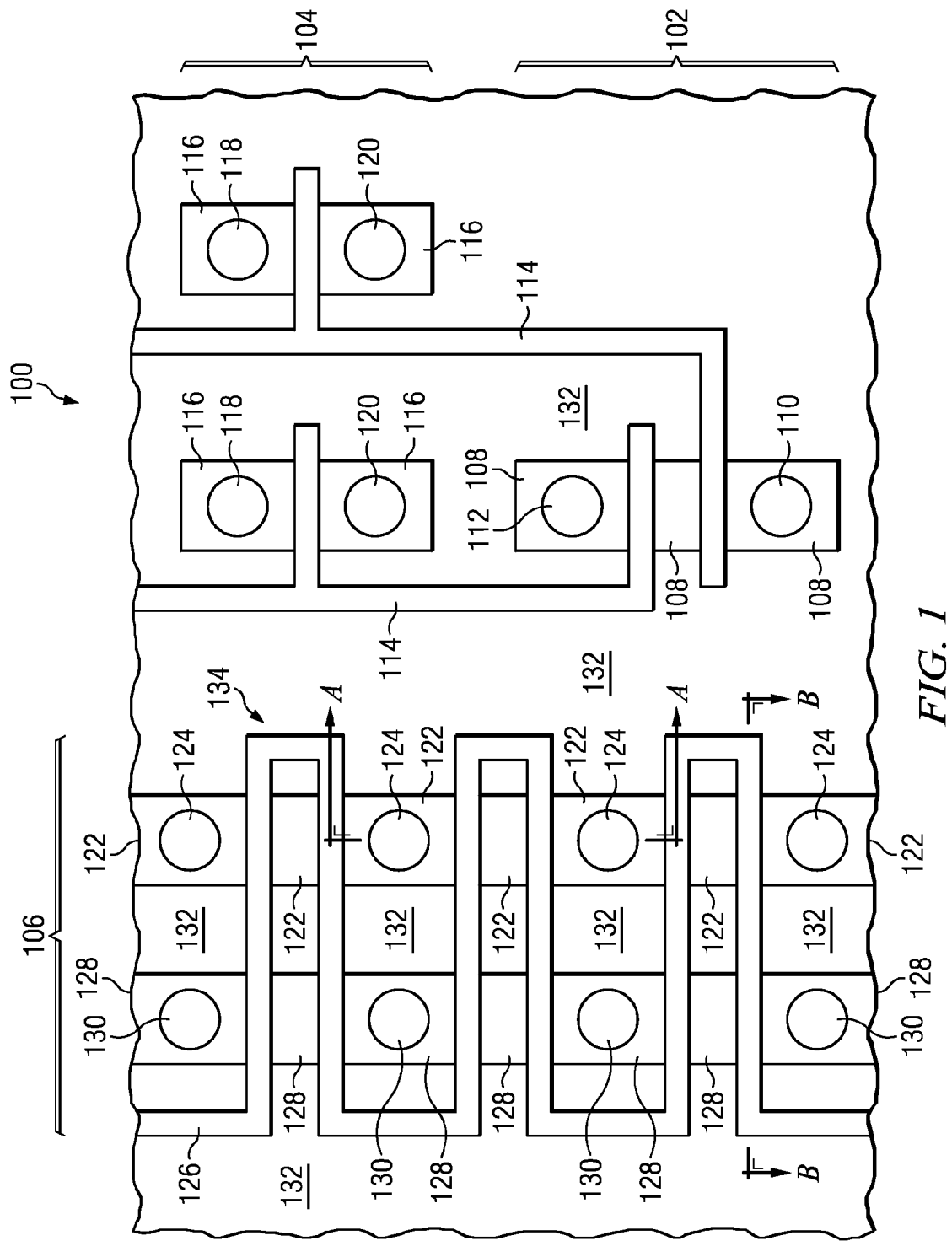
FIG. 1 is a top view of an IC containing NMOS transistors, p-channel metal oxide semiconductor (PMOS) transistors, and a serpentine double gated diode array formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The problem of detecting and isolating stress induced defects in n-channel metal oxide semiconductor (NMOS) transistors contained in integrated circuits (ICs) is addressed by the instant invention, which provides a serpentine double gated diode array configured to maximize a sensitivity to stress induced defects that may be electrically tested to estimate a density of stress induced defects and which is compatible with scanning capacitance microscopy (SCM) and scanning spreading resistance microscopy (SSRM) for isolation of instances of stress induced defects.

FIG. 1 is a top view of an IC 100 containing NMOS transistors 102, p-channel metal oxide semiconductor (PMOS) transistors 104, and a serpentine double gated diode array 106 formed according to an embodiment of the instant invention. The NMOS transistors 102 include n-type NMOS active areas 108 formed at a top surface region of the IC 100, a Vss contact 110 formed on a top surface of the NMOS active areas 108, an NMOS output node contact 112 formed on the top surface of the NMOS active areas 108 and logic gates 114 formed over the top surface of the NMOS active areas 108. The PMOS transistors 104 include p-type PMOS active areas 116 formed at the top surface region of the IC 100, Vdd contacts 118 formed on a top surface of the PMOS active areas 116, PMOS output node contacts 120 formed on the top surface of the PMOS active areas 116, and the logic gates 114 formed over the top surface of the PMOS active areas 116. The serpentine double gated diode array 106 includes n-type cathode active areas 122 formed at the top surface region of the IC 100, cathode contacts 124 formed on a top surface of the cathode active areas 122, a serpentine gate structure 126 formed over the top surface of the cathode active areas 122, p-type substrate contact areas 128 formed at the top surface region of the IC 100 and substrate contacts 130 formed on a top surface of the substrate contact areas 128. The double gated diode configuration in which adjacent segment pairs of the serpentine gate structure 126 cross an n-type cathode active area 122 with less than 400 nanometers separation, and connect in a loop 134 within 300 nanometers of the n-type cathode active area 122 is more sensitive to stress induced defects than other gated diode configurations. This sensitivity is advantageous because the inventive serpentine double gated diode array may provide accurate estimates of a stress induced defect density.

The NMOS active areas 108, PMOS active areas 116, cathode active areas 122 and substrate contact areas 128 are separated on the top surface of the IC 100 by field oxide 132, typically formed by a shallow trench isolation (STI) process sequence, in which trenches, commonly 200 to 500 nanometers deep, are etched into the IC 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). The field oxide exerts a lateral stress on the NMOS active areas 108, which may contribute to formation of stress induced defects.

The serpentine double gated diode array 106 is tested electrically by grounding the substrate contacts 130 and applying a positive voltage, preferably between 0.6 and 1.0 volts, to the cathode contacts 124, and measuring a cathode current through the cathode active areas 122. Instances of serpentine double gated diode arrays which exhibit cathode current values significantly above an average current value, for example above an average current plus three or more current standard deviations, may indicate the presence of stress induced defects in the cathode active areas of the serpentine double gated diode arrays.

Figure 2A:
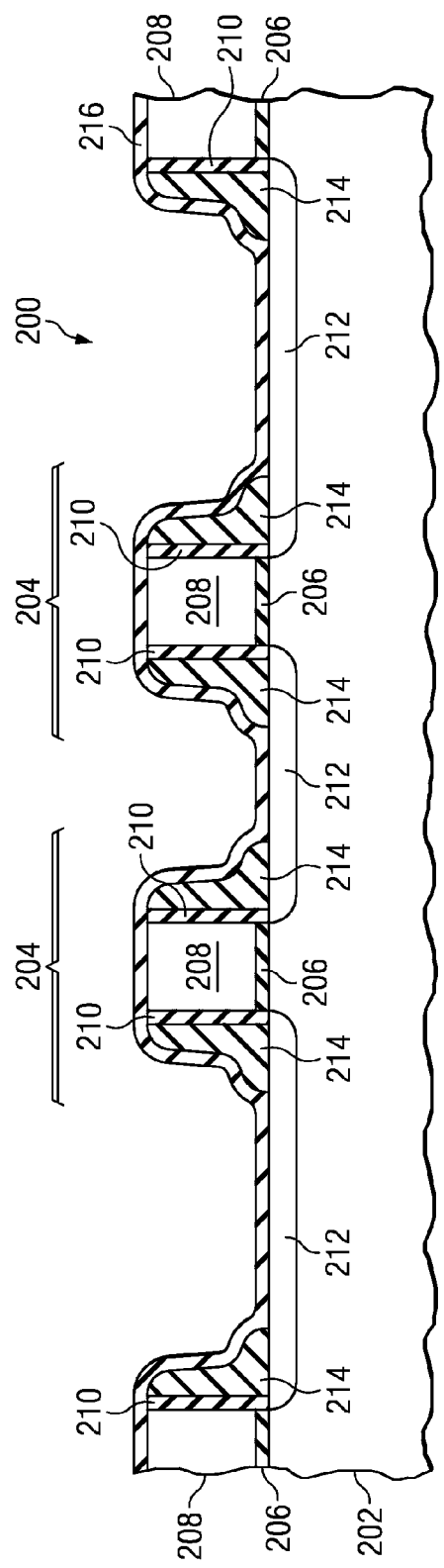
FIG. 2A through FIG. 2F are cross-sections of an IC containing a serpentine double gated diode array in successive stages of fabrication, according to an embodiment of the instant invention.

FIG. 2A through FIG. 2F are cross-sections of an IC containing a serpentine double gated diode array in successive stages of fabrication, according to an embodiment of the instant invention, as for example, the IC depicted in FIG. 1 along the section line A-A. Referring to FIG. 2A, the IC 200 is formed on a substrate 202, typically p-type single crystal silicon, but possibly another substrate material suitable for fabrication of complementary metal oxide semiconductor (CMOS) ICs. It is common to form a p-type well, commonly known as a p-well, not shown in FIG. 2A for clarity, which extends from a top surface of the substrate 202 to a depth between 300 and 600 nanometers, in regions defined for n-type active areas. A serpentine gate structure 204 is formed on the top surface of the substrate, such that adjacent segment pairs of the serpentine gate structure 204 are laterally separated by less than 400 nanometers. The serpentine gate structure 204 includes a gate dielectric layer 206, typically silicon dioxide, nitrogen doped silicon dioxide, silicon oxy-nitride, hafnium oxide, layers of silicon dioxide and silicon nitride, or other insulating material, formed by known methods on a top surface of the substrate 202. A metal oxide semiconductor (MOS) gate 208, typically polycrystalline silicon, is formed on a top surface of the gate dielectric layer 206, commonly by deposition of a layer of gate material on the top surface of the gate dielectric layer 206, formation of a gate photoresist pattern, not shown in FIG. 2A for clarity, on a top surface of the layer of gate material by known photolithographic methods, removal of unwanted gate material by known etching methods, followed by removal of the gate photoresist pattern, commonly by exposing the IC 200 to an oxygen containing plasma, followed by a wet cleanup to remove any organic residue from the top surface of the MOS gate 208. NMOS lightly doped drain (NLDD) offset spacers 210, typically silicon dioxide or silicon nitride or layers of silicon dioxide and silicon nitride, commonly 1 to 50 nanometers thick, are formed on lateral surfaces of the MOS gate 208. N-type NLDD regions 212 are formed in a top region of the substrate 202 adjacent to the NLDD offset spacers 210, typically by ion implanting a first set of n-type dopants such as phosphorus and arsenic, and possibly antimony, in a total dose between $1 \cdot 10^{13}$ and $1 \cdot 10^{15}$ atoms/cm$^2$ into the top region of the substrate 202 at a depth between 5 and 50 nanometers. A first set of p-type dopants, including boron, commonly in the form BF$_2$, and possibly gallium and indium, is typically ion implanted in a total dose between $1 \cdot 10^{11}$ and $1 \cdot 10^{13}$ atoms/ cm$^2$ into the top region of the substrate adjacent to the NLDD regions 212 to improve off-state leakage current of NMOS transistors. Gate sidewall spacers 214 are formed on lateral surfaces of the NLDD offset spacers 210, typically by conformal deposition of layers of silicon dioxide and silicon nitride, followed by an anisotropic etchback which removes the layers of silicon dioxide and silicon nitride from top surfaces of the MOS gate 208 and NLDD regions 212, leaving the gate sidewall spacers 214.

Still referring to FIG. 2A, a stress memorization technique (SMT) layer 216, commonly silicon nitride between 10 and 50 nanometers thick and commonly deposited by known methods of plasma enhanced chemical vapor deposition (PECVD) such that the SMT layer 216 has more than 1000 MPa of tensile stress, is formed on top surfaces of the MOS gate 208 and NLDD regions 212.

Figure 2B:
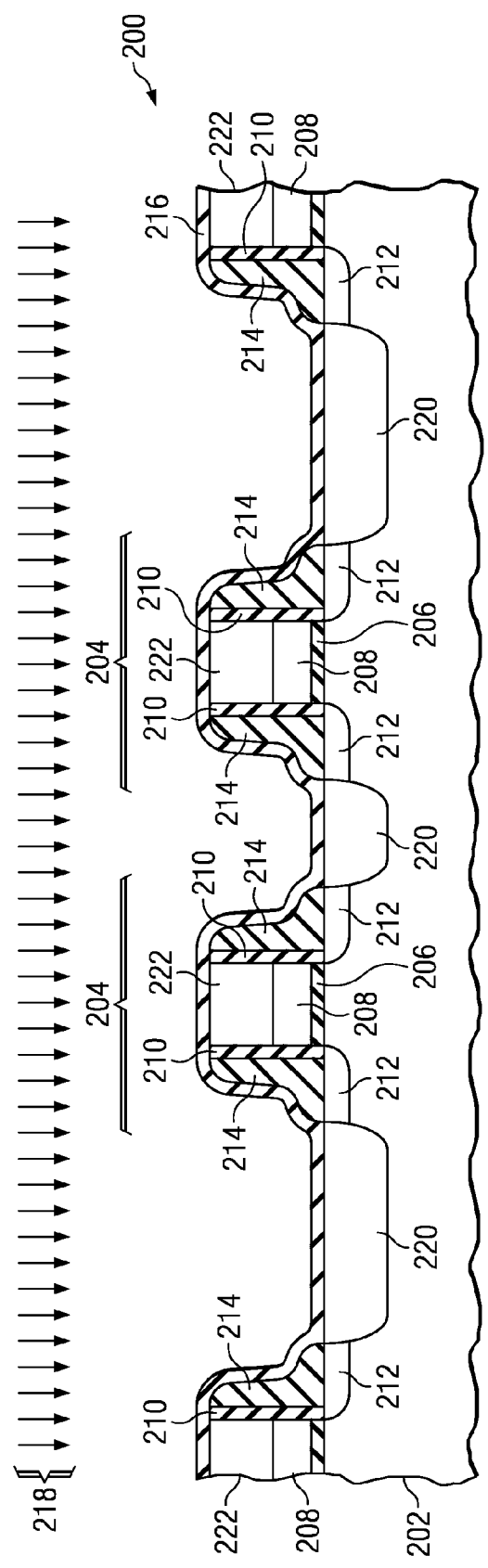

FIG. 2B depicts the IC 200 during an n-type source/drain (NSD) ion implant process. A second set of n-type dopants 218, typically phosphorus and possibly arsenic and antimony, are ion implanted into the top region of the substrate 202 and a top region of the MOS gate 208 in a total dose between $3 \cdot 10^{14}$ and $3 \cdot 10^{16}$ atoms/cm$^2$ into the top region of the substrate 202 at a depth between 30 and 100 nanometers, to form NSD implanted regions 220 in the substrate 202 adjacent to the gate sidewall spacers 214 and a gate implanted region 222 in the top region of the MOS gate 208. The NSD implanted regions 220 and the gate implanted region 222 are partially or completely amorphized by the ion implantation of the second set of n-type dopants 218. The second set of n-type dopants 218 is blocked from areas on the IC 200 outside the NSD areas by an NSD photoresist pattern, not shown in FIG. 2B for clarity. The NSD photoresist pattern is removed after the second set of n-type dopants 218 is ion implanted.

Figure 2C:
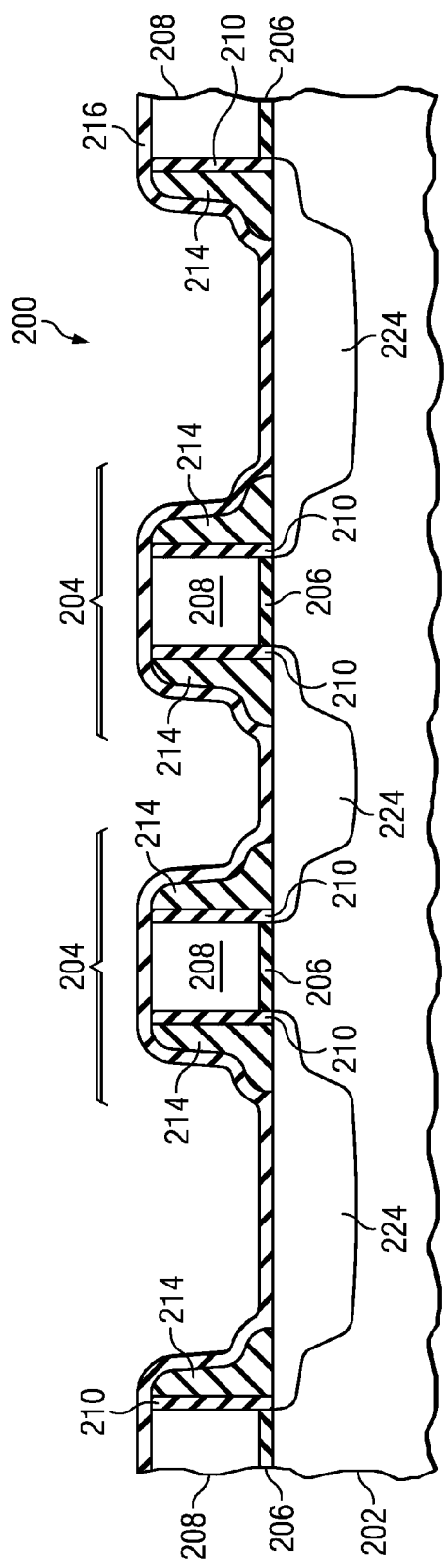

FIG. 2C depicts the IC 200 after a source/drain anneal process which heats the IC 200, typically above 1000 C for less than 5 seconds, such that the amorphous regions in the NSD implanted regions are converted to single crystal phase, the gate implanted region is converted to a polycrystalline phase. Also during the source/drain anneal process, a portion of the n-type dopants in the NSD implanted regions are electrically activated, forming n-type source/drain regions 224. During the conversion of the amorphous regions in the gate implanted region to polycrystalline phase, the tensile stress in the SMT layer 216 causes tensile stress to be developed in an NMOS channel region in the substrate 202 immediately below the gate dielectric layer 206. tensile stress in an NMOS channel improves NMOS transistor on-static drive current.

Figure 2D:
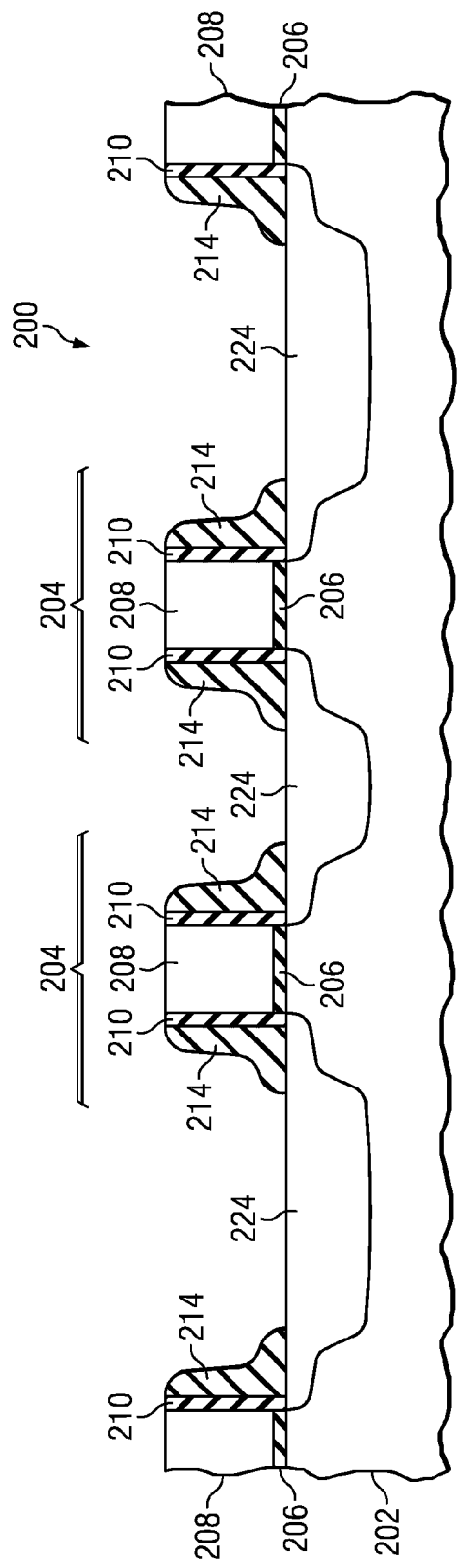

FIG. 2D depicts the IC 200 after removal of the SMT layer by known etching methods, in a manner that leaves tensile stress in the NMOS channel region in the substrate 202 immediately below the gate dielectric layer 206.

Figure 2E:
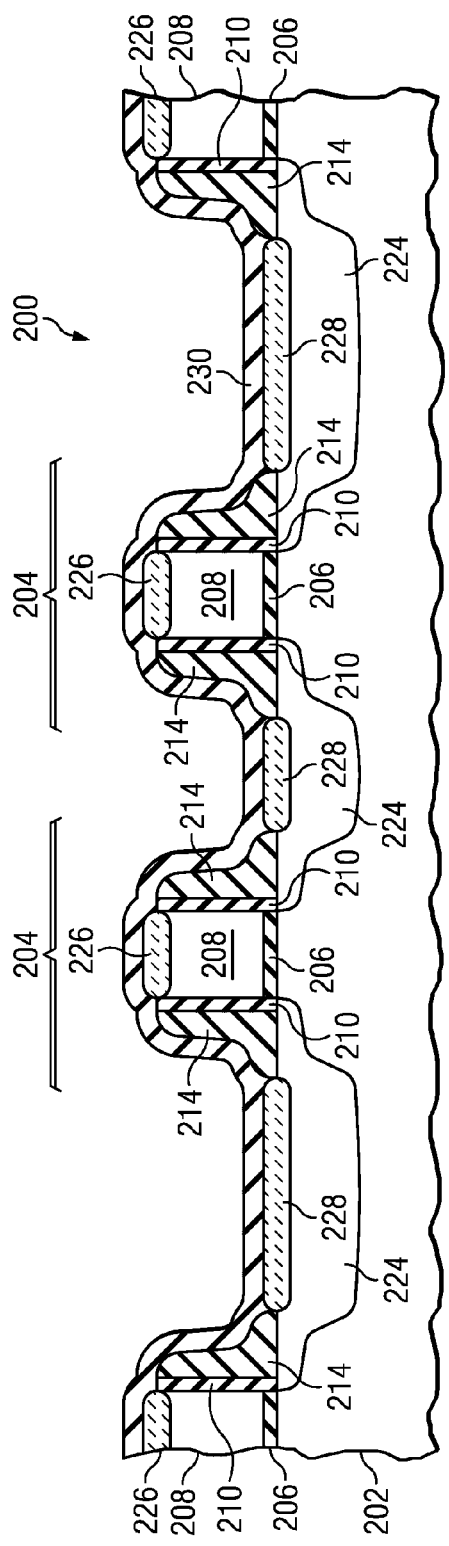

FIG. 2E depicts the IC 200 at a subsequent stage of fabrication. Metal silicide, typically nickel silicide, but possibly cobalt silicide or other metal silicide, is formed on top surfaces of the NMOS gate 208 and the n-type source/drain regions 224, commonly by deposition of a conformal layer of metal, nickel or a mixture of nickel and platinum for nickel silicide, cobalt for cobalt silicide, or other appropriate metal, heating the IC 200 to cause a reaction of the deposited metal with silicon at the top surfaces of the NMOS gate 208 and the n-type source/drain regions 224 to form metal silicide, followed by selective removal of unreacted metal, so as to leave a gate silicide layer 226 and NSD silicide layers 228 at the top surfaces of the NMOS gate 208 and the n-type source/drain regions 224, respectively. Formation processes for metal silicide are well known by practitioners of IC fabrication, and vary widely depending on the particular metal silicide selected for use and other details of an IC fabrication process sequence.

Still referring to FIG. 2E, a pre-metal dielectric (PMD) liner 230 is formed on top surfaces of the serpentine gate structure 204, typically silicon nitride with a tensile stress greater than 1000 MPa, which causes tensile stress to be developed in the NMOS channel region in the substrate 202 immediately below the gate dielectric layer 206. As with the tensile stress resulting from the SMT liner, tensile stress in an NMOS channel from the PMD liner 230 improves NMOS transistor on-state drive current.

Figure 2F:
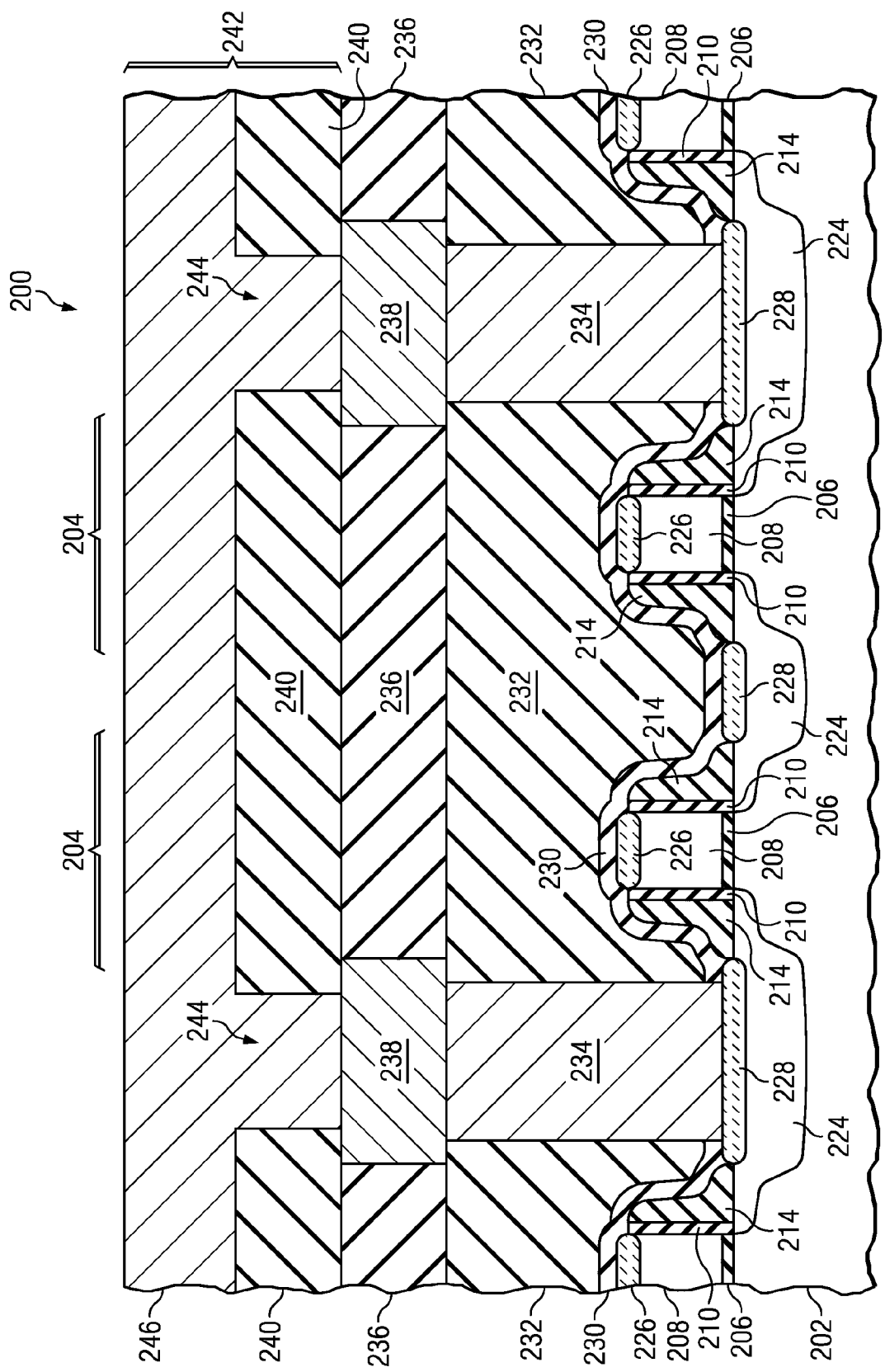

FIG. 2F depicts the IC 200 after formation of interconnect elements in the serpentine double gated diode array. A PMD layer 232, typically a dielectric layer stack including a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the PMD liner 230. Cathode contacts 234 are formed in the PMD layer 232 to make electrical contact to the NSD silicide layers 228, typically by forming a contact photoresist pattern to define contact regions, forming contact holes in the contact regions by removing unwanted PMD layer material and PMD liner material using known etching methods to expose the NSD silicide layers 228, and filling the contact holes with a contact metal, typically tungsten, preceded by an optional contact liner metal such as titanium, titanium nitride, tantalum or tantalum nitride. An intra-metal dielectric (IMD) layer 236, typically a material with a dielectric constant less than silicon dioxide, commonly known as a low-k material, such as organo-silicate glass (OSG), carbon-doped silicon oxides (SiCO or CDO) or methylsilsesquioxane (MSQ), commonly between 60 and 200 nanometers thick, is formed on top surfaces of the PMD layer 232 and the cathode contacts 234. Elements of a first horizontal interconnect metal layer 238, typically copper with a liner metal, are formed in the IMD layer 236 by known methods, connecting to the cathode contacts 234. An inter-level dielectric (ILD) layer 240, also typically low-k material, commonly between 120 and 300 nanometers thick, is formed on top surfaces of the IMD layer 236 and first interconnect metal layer elements 238. Elements of a second interconnect metal layer 242, also typically copper with a liner metal, including a first set of interconnect vias 244 and a second horizontal interconnect metal layer 246, are formed in the ILD layer 240 connecting to the elements of the first horizontal interconnect metal layer 238 by known methods.

The serpentine double gated diode array is tested electrically by grounding the substrate 202 and applying a positive voltage to the second horizontal interconnect metal layer 246 while measuring a current through the n-type source/drain regions 224. Stress induced defects cause excess current through the n-type source/drain regions 224, thus allowing the tester to identify instances of the serpentine double gated diode array with such defects.

Figure 3:
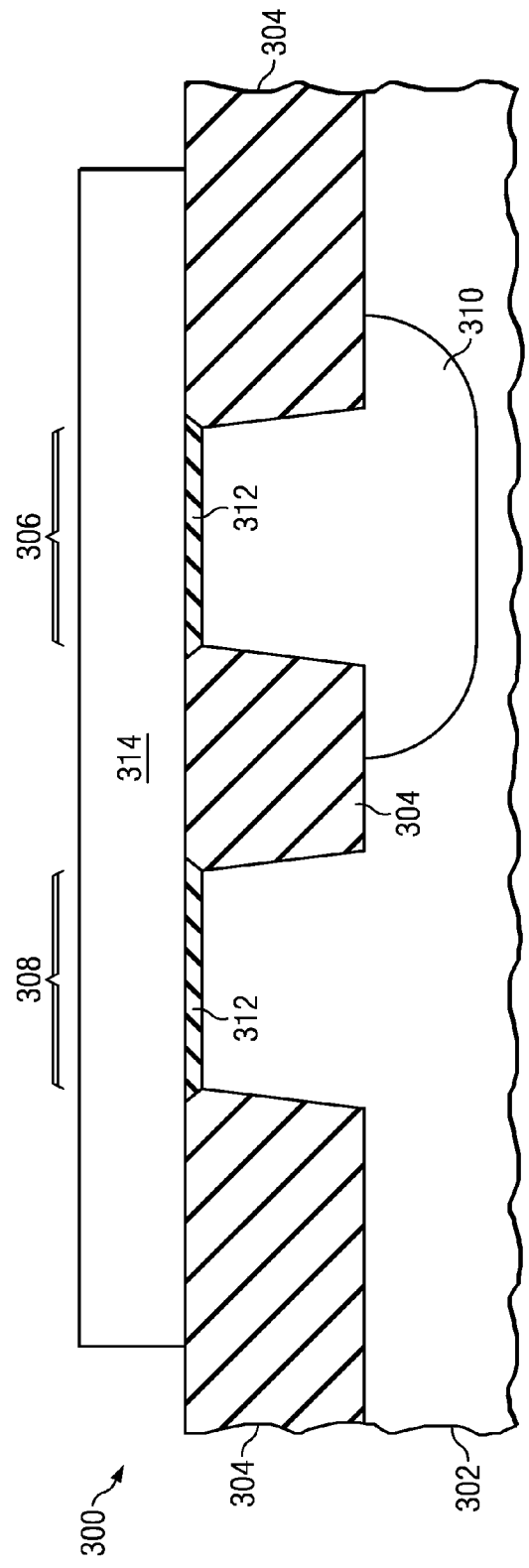
FIG. 3 is a cross-section of an IC containing a serpentine double gated diode array formed according to an embodiment of the instant invention.

FIG. 3 is a cross-section of an IC containing a serpentine double gated diode array formed according to an embodiment of the instant invention, as for example, the IC depicted in FIG. 1 along the section line B-B. The IC 300 is formed on a p-type substrate 302 which has properties as described in reference to FIG. 2A. Elements of field oxide 304 are formed by STI processes, extending from a top surface of the substrate 302 to a depth of 200 to 500 nanometers, surrounding an area defined for n-type source/drain regions 306 and an area defined for p-type substrate contact regions 308. A p-well 310 is formed in the substrate in the area defined for n-type source/drain regions 306, typically by ion implanting a first set of p-type dopants, including boron and possibly gallium and/or indium, at doses from $1 \cdot 10^{11}$ to $1 \cdot 10^{14}$ atoms/$cm^2$, into the regions defined for n-type source/drain regions. A p-well photoresist pattern, not shown in FIG. 3 for clarity, is commonly used to block the first set of p-type dopants from areas outside the p-well. The p-well 310 extends from a top surface of the substrate 302 to a depth typically 50 to 500 nanometers below a bottom surface of the field oxide elements 304. The ion implantation process to form the p-well 310 may include additional steps to implant additional p-type dopants at shallower depths for purposes of improving NMOS transistor performance, such as threshold adjustment, leakage current reduction and suppression of parasitic bipolar operation. A gate dielectric layer 312, typically including the materials recited in reference to FIG. 2A, is formed on a top surface of the substrate 302 in the areas defined for n-type source/drain regions 306 for p-type substrate contact regions 308. An MOS gate segment 314 which is part of a serpentine gate structure is formed on a top surface of the gate dielectric layer 312 and the field oxide elements 304, by processes described in reference to FIG. 2A. N-type source/drain regions are formed in the substrate 302 in the area defined for n-type source/drain regions 306, adjacent to the MOS gate segment 314, out of the plane of FIG. 3, and so are not shown in FIG. 3 for clarity. Similarly, p-type substrate contact regions are formed in the substrate 302 in the area defined for p-type substrate contact regions 308, adjacent to the MOS gate segment 314, out of the plane of FIG. 3, and so are not shown in FIG. 3 for clarity. The field oxide elements 304 exert a lateral stress on the n-type source/drain regions, which may contribute to formation of stress induced defects.

Figure 4:
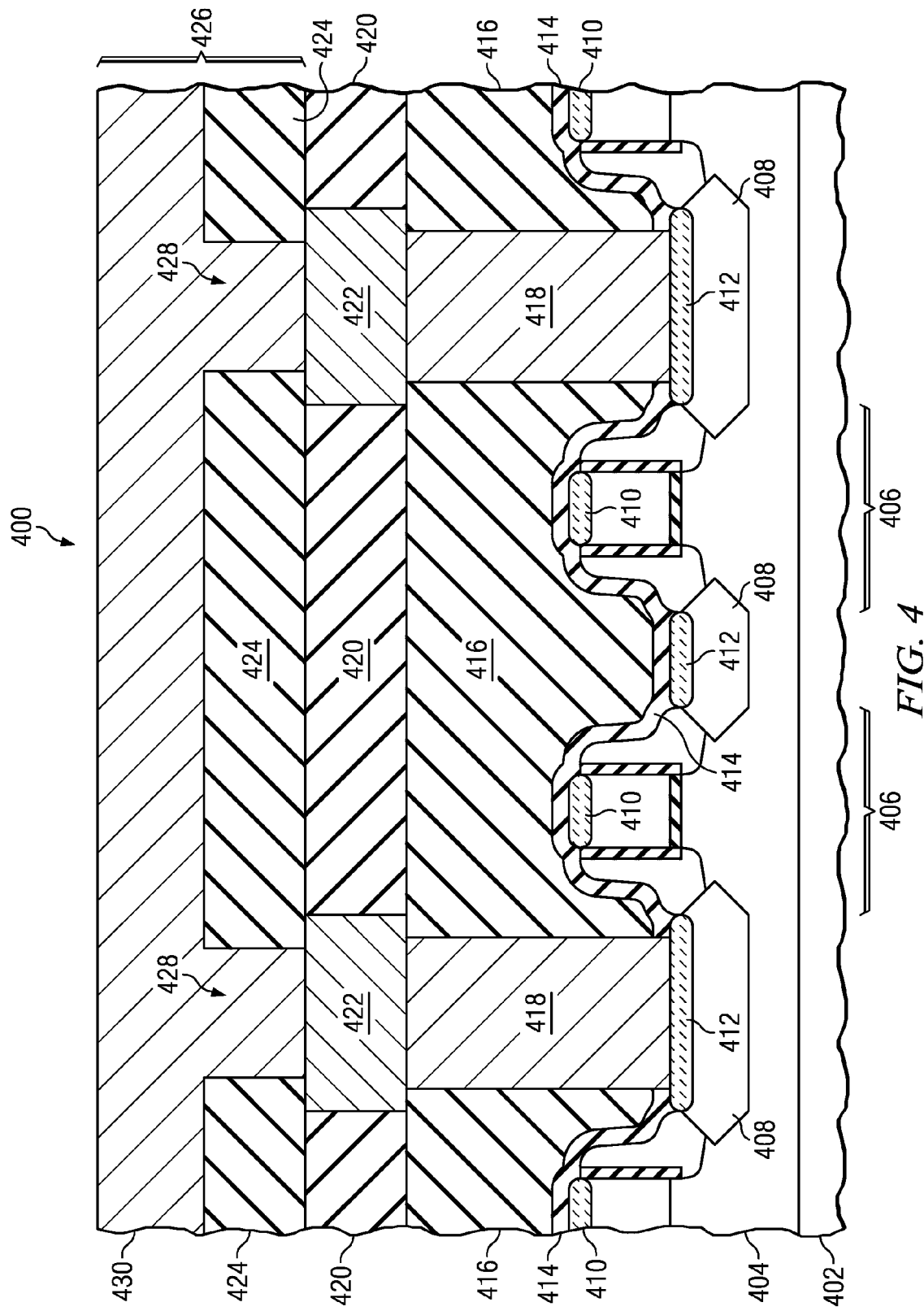
FIG. 4 depicts a cross-section of an IC containing a serpentine double gated diode array which may be suitable for monitoring stress induced defects in PMOS transistors.

FIG. 4 depicts a cross-section of an IC containing a serpentine double gated diode array which may be suitable for monitoring stress induced defects in PMOS transistors. The IC 400 is formed on a p-type substrate 402 with the properties described in reference to FIG. 2A. An n-type well 404, commonly known as an n-well, is formed in the substrate 402, typically by ion implanting a first set of n-type dopants, including phosphorus and arsenic, and possibly antimony, at doses from $1 \cdot 10^{11}$ to $1 \cdot 10^{14}$ atoms/$cm^2$, into an area defined for p-type source/drain regions. An n-well photoresist pattern, not shown in FIG. 4 for clarity, is commonly used to block the first set of n-type dopants from areas outside the n-well 404. The n-well 404 extends from the top surface of the substrate 402 typically to a depth of 250 to 600 nanometers. The ion implantation process to form the n-well 404 may include additional steps to implant additional n-type dopants at shallower depths for purposes of improving PMOS transistor performance, such as threshold adjustment, leakage current reduction and suppression of parasitic bipolar operation. A sheet resistivity of the n-well 404 is commonly between 100 and 1000 ohms/square. A serpentine gate structure 406 is formed on a top surface of the substrate 402 in a manner similar to that discussed in reference to FIG. 2A. P-type source/drain regions 408 are formed of silicon-germanium, commonly designated by the term Si—Ge, using known methods. The Si—Ge regions 408 exert a compressive lateral stress on a PMOS channel region in the substrate 402 immediately below the serpentine gate structure 406. Compressive stress in a PMOS channel improves PMOS transistor on-state drive current. Gate silicide layers 410 and p-type source/drain (PSD) silicide layers 412 are formed on top surfaces of the serpentine gate structure 406 and P-type source/drain regions 408, respectively, by the metal silicide processes discussed in reference to FIG. 2E. A PMD liner 414, typically silicon nitride, is formed on top surfaces of the serpentine gate structure 406 and P-type source/drain regions 408. A PMD layer 416, typically of one of the materials discussed in reference to FIG. 2F, is formed on a top surface of the PMD liner 414. Anode contacts 418, an IMD layer 420, elements of a first horizontal interconnect metal layer 422, an ILD layer 424, and elements of a second interconnect metal layer 426, including a first set of interconnect vias 428 and a second horizontal interconnect metal layer 430, are formed in and on the PMD layer 416, as discussed in reference to FIG. 2F.

The serpentine double gated diode array depicted in FIG. 4 is tested electrically by grounding the substrate 402 and applying a negative voltage to the second horizontal interconnect metal layer 430 while measuring a current through the p-type source/drain regions 408. Stress induced defects cause excess current through the p-type source/drain regions 408, thus allowing the tester to identify instances of the serpentine double gated diode array with such defects.

Figure 5A:
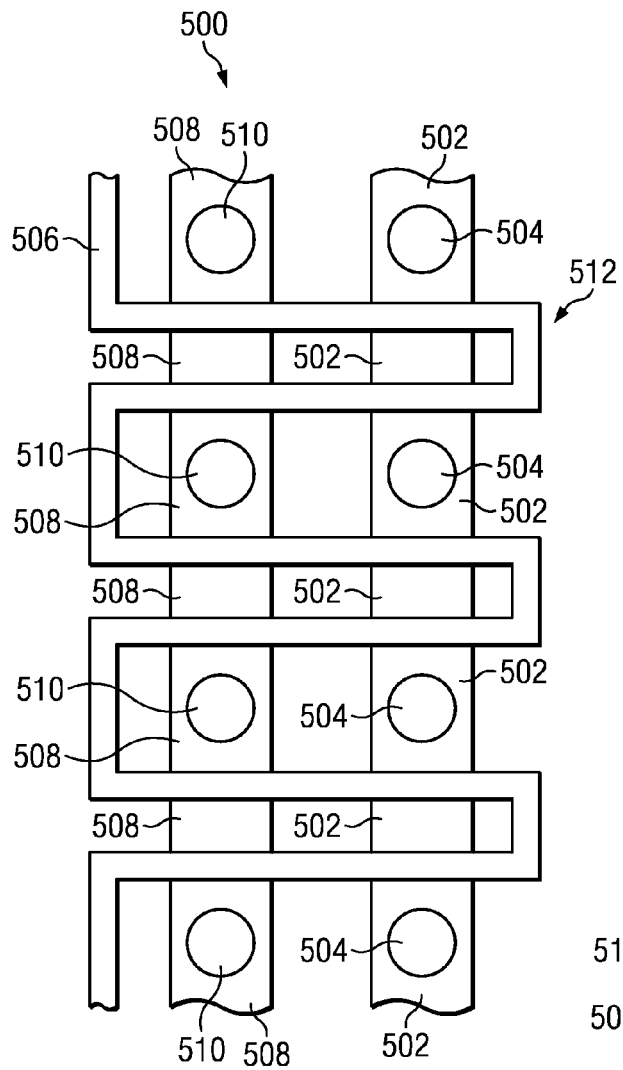
FIG. 5A through FIG. 5D are top views of serpentine double gated diode arrays formed according to the instant invention.

FIG. 5A through FIG. 5D are top views of serpentine double gated diode arrays formed according to the instant invention, which have variations in layout parameters that have been demonstrated in work done on the instant invention to affect a sensitivity to stress induced defects. FIG. 5A depicts a first serpentine double gated diode array 500 which includes n-type cathode active areas 502, cathode contacts 504, a first serpentine gate structure 506 formed over the top surface of the cathode active areas 502, p-type substrate contact areas 508 and substrate contacts 510. Adjacent segment pairs of the first serpentine gate structure 506 cross the n-type cathode active areas 502 with less than 400 nanometers separation, and connect in a first set of loops 512 within 300 nanometers of the cathode active areas 502.

Figure 5B:
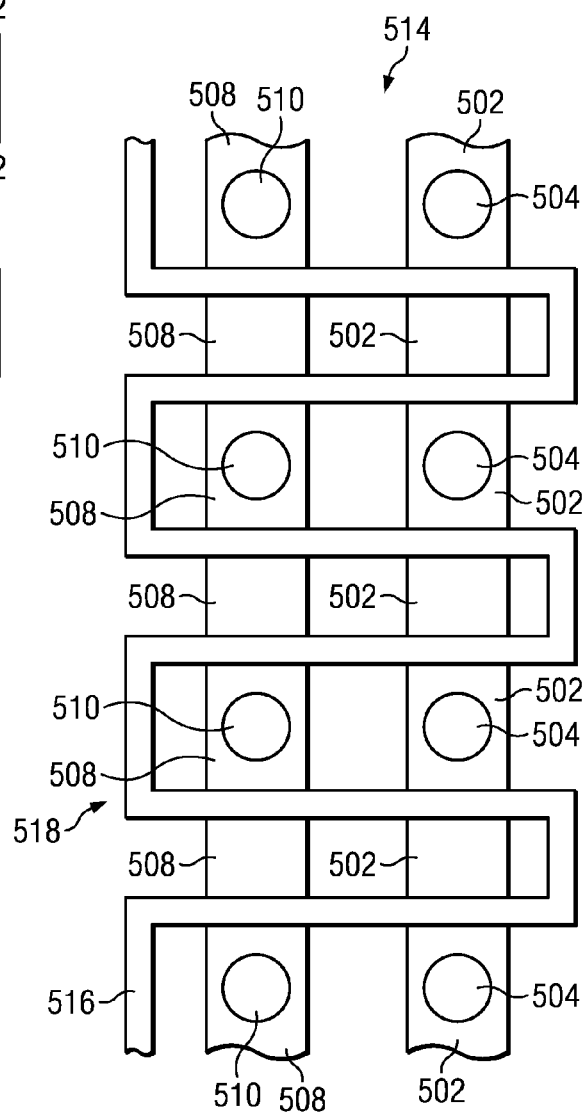

FIG. 5B depicts a second serpentine double gated diode array 514 which includes n-type cathode active areas 502, cathode contacts 504, a second serpentine gate structure 516 formed over the top surface of the cathode active areas 502, p-type substrate contact areas 508 and substrate contacts 510. Adjacent segment pairs of the second serpentine gate structure 516 cross the n-type cathode active areas 502 with more than 400 nanometers separation, and connect in a second set of loops 518 at a same distance from the cathode active areas 502 as the first set of loops 512 depicted in FIG. 5A.

Figure 5C:
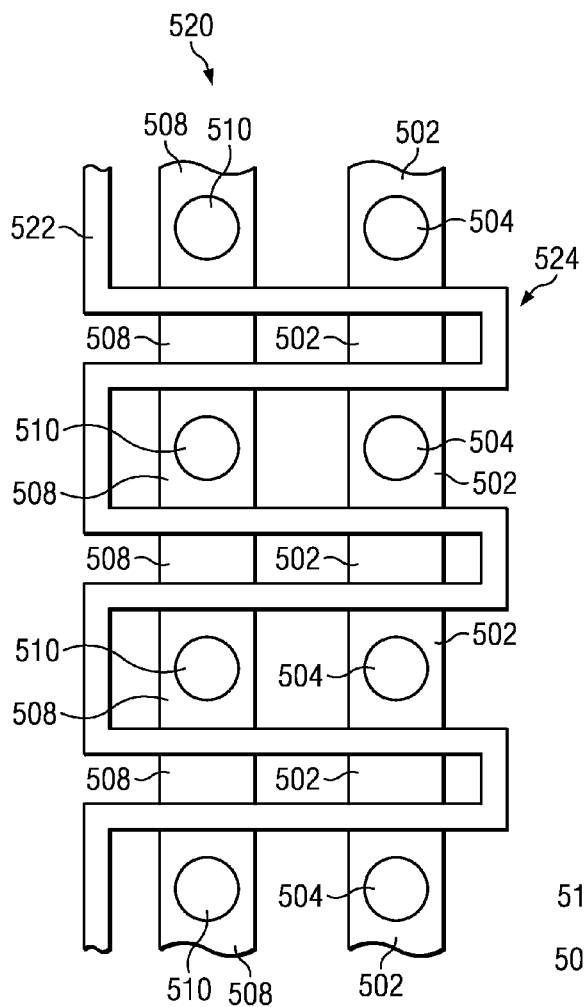

FIG. 5C depicts a third serpentine double gated diode array 520 which includes n-type cathode active areas 502, cathode contacts 504, a third serpentine gate structure 522 formed over the top surface of the cathode active areas 502, p-type substrate contact areas 508 and substrate contacts 510. Adjacent segment pairs of the third serpentine gate structure 522 cross the n-type cathode active areas 502 with a same separation as the segments of the first serpentine gate structure 516 depicted in FIG. 5A, and connect in a third set of loops 524 farther than 300 nanometers from the cathode active areas 502.

Figure 5D:
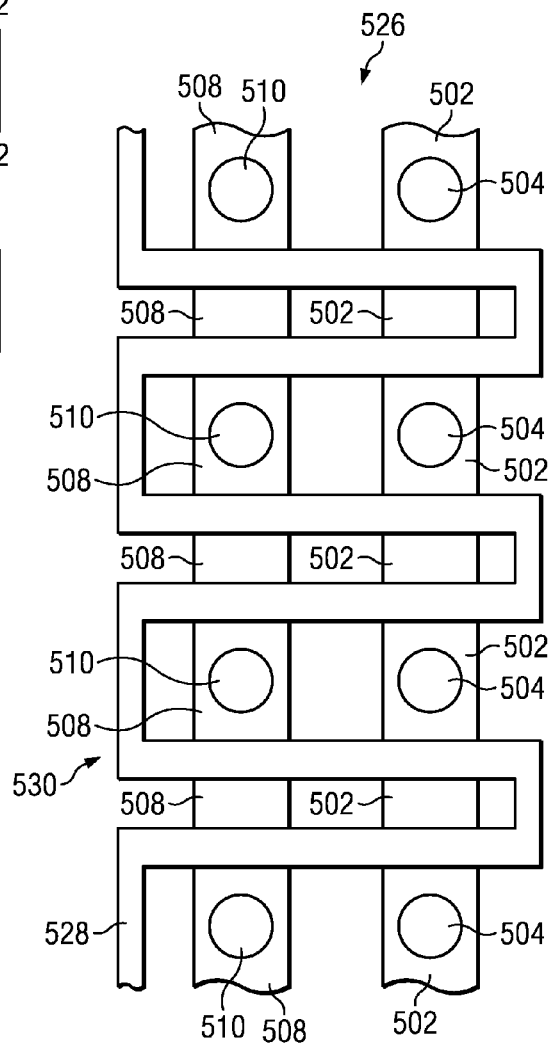

FIG. 5D depicts a fourth serpentine double gated diode array 526 which includes n-type cathode active areas 502, cathode contacts 504, a fourth serpentine gate structure 528, with a width, commonly known as gate length, substantially 50 percent more than a gate length of the first serpentine gate structure 506 depicted in FIG. 5A, formed over the top surface of the cathode active areas 502, p-type substrate contact areas 508 and substrate contacts 510. Adjacent segment pairs of the fourth serpentine gate structure 528 cross the n-type cathode active areas 502 with a same separation as the segments of the first serpentine gate structure 516 depicted in FIG. 5A, and connect in a fourth set of loops 530 at a same distance from the cathode active areas 502 as the first set of loops 512 depicted in FIG. 5A.

Electrical testing of the first serpentine double gated diode array 500, the second serpentine double gated diode array 514, the third serpentine double gated diode array 520 and the fourth serpentine double gated diode array 526 proceeds in the same manner as discussed in reference to FIG. 1: grounding the substrate contacts 510 and applying a positive voltage, preferably between 0.6 and 1.0 volts, to the cathode contacts 504, and measuring a cathode current through the cathode active areas 502. Differences in distributions of cathode currents between sets of the first serpentine double gated diode array 500 and the second serpentine double gated diode array 514 may indicate a sensitivity of stress induced defect formation on a separation of serpentine gate structure segments over cathode active areas, which in turn may indicate an optimum separation between adjacent gate segments in circuits of an IC.

Similarly, differences in distributions of cathode currents between sets of the first serpentine double gated diode array 500 and the third serpentine double gated diode array 520 may indicate a sensitivity of stress induced defect formation on a distance of serpentine gate structure loops from cathode active areas, which in turn may indicate an optimum gate loop separation from n-type active areas in circuits of an IC.

Similarly, differences in distributions of cathode currents between sets of the first serpentine double gated diode array 500 and the fourth serpentine double gated diode array 526 may indicate a sensitivity of stress induced defect formation on a gate length of serpentine gate structure segments over cathode active areas which in turn may indicate an optimum gate length over n-type active areas in circuits of an IC.

Serpentine double gated diode arrays including p-type source/drain regions crossed by serpentine gates, as described in reference to FIG. 4, may also be fabricated with variations in adjacent gate segment separation, loop to p-type active area distance and gate length, and tested as described in reference to FIG. 5A through FIG. 5D, in order to obtain information on optimum PMOS layout parameters for circuits of an IC.

Figure 6A:
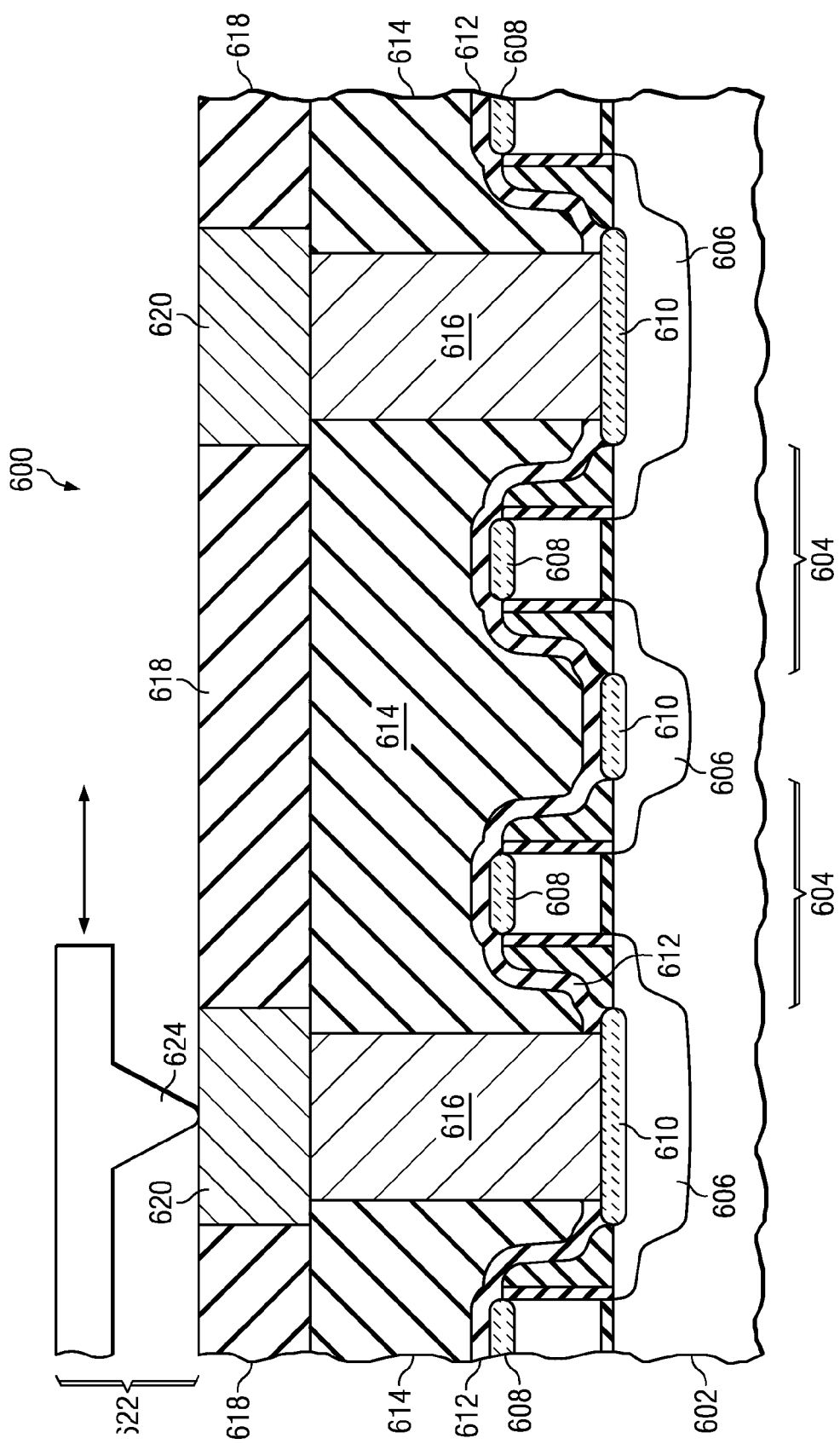
FIG. 6A and FIG. 6B are depictions of processes of testing serpentine double gated diode arrays using SCM and SSRM.
Figure 6B:
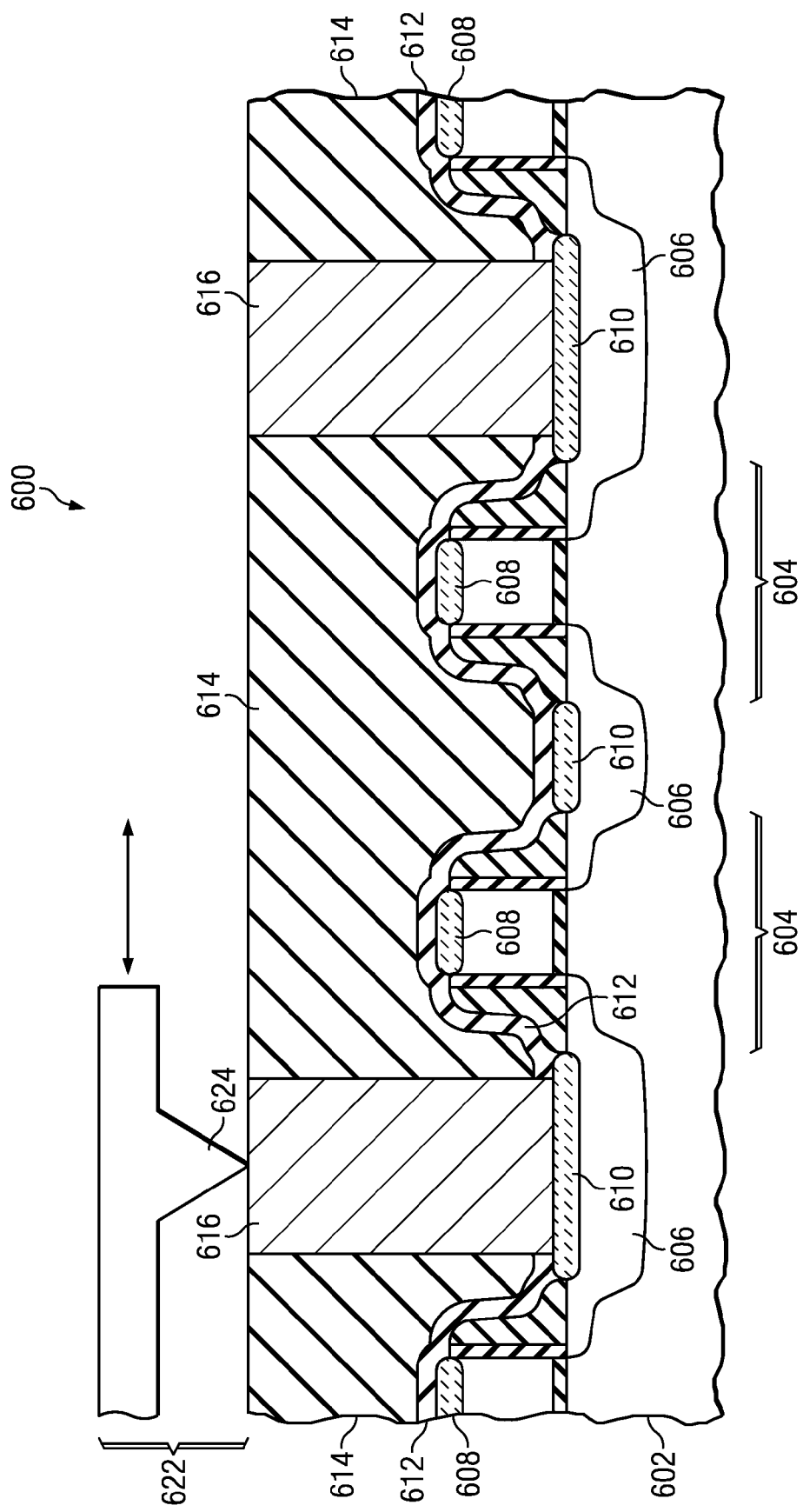

FIG. 6A and FIG. 6B are depictions of processes of testing serpentine double gated diode arrays using SCM and SSRM. SCM is a known method of mapping semiconductor junction parameters by measuring a spatial distribution of capacitance as a function of DC voltage. SSRM is a known method of mapping semiconductor carrier density by measuring a spatial distribution of DC impedance. Referring to FIG. 6A, an IC 600 is formed on a substrate 602. A serpentine gate structure 604 is formed on a top surface of the substrate 602. N-type source/drain regions 606 are formed in the substrate 602 adjacent to the serpentine gate structure 604. A gate silicide layer 608 and n-type source/drain (NSD) silicide layers 610 are formed on top surfaces of the serpentine gate structure 604 and n-type source/drain regions 606, respectively. A PMD liner 612 is formed on top surfaces of the gate silicide layer 608 and n-type source/drain (NSD) silicide layers 610. A PMD layer 614 is formed on a top surface of the PMD liner 612. Cathode contacts 616 are formed in the PMD layer 614 connecting to the NSD silicide layers 610. An intra-metal dielectric (IMD) layer 618 is formed on top surfaces of the PMD layer 614 and the cathode contacts 616. Elements of a first horizontal interconnect metal layer 620 are formed in the IMD layer 618 connecting to the cathode contacts 616. The formation processes and properties of the serpentine gate structure 604, the n-type source/drain regions 606, the gate silicide layer 608, the NSD silicide layers 610, the PMD liner 612, the PMD layer 614, the cathode contacts 616, the IMD layer 618 and the elements of the first horizontal interconnect metal layer 620 are as discussed in reference to FIG. 2A through FIG. 2F.

Continuing to refer to FIG. 6A, an scanning probe 622, which includes an scanning probe tip 624, scans laterally across a top surface of the IMD layer 618, making periodic contact to top surfaces of the IMD layer 618 and the elements of the first horizontal interconnect metal layer 620. During contact between the SCM tip 624 and an element of the first horizontal interconnect metal layer 620, SCM equipment, not shown in FIG. 6A for clarity, which is electrically connected to the scanning probe 622, measures capacitances at several DC voltages of n-type source/drain regions 606 which are electrically connected to the element of the first horizontal interconnect metal layer 620 being contacted. Instances of n-type source/drain regions 606 which have stress induced defects exhibit anomalous capacitance values as a function of DC voltage. In this manner, SCM advantageously provides a method of identifying locations of stress induced defects and characterizing the defects. Similarly, SSRM equipment may be connected to the scanning probe 622 to measure DC impedances of the n-type source drain regions 606. Instances of n-type source/drain regions 606 which have stress induced defects also exhibit anomalous DC impedance values. In this manner,. SSRM advantageously provides a method of identifying locations of stress induced defects and characterizing the defects.

The probing method described in reference to FIG. 6A may be performed on an IC which has been partially fabricated, leaving the elements of the first horizontal interconnect metal layer 620 exposed for probing. This procedure is advantageous for monitoring ICs during fabrication. Similarly, an IC which has been fabricated to a further stage, including complete fabrication, and subsequently deprocessed to expose the elements of the first horizontal interconnect metal layer 620 may be for probed. This is advantageous for monitoring and troubleshooting completed ICs.

It will be recognized by practitioners of IC fabrication that the configuration of interconnect elements which allows SCM and SSRM probing may be extended to a second horizontal interconnect level, and so forth, by appropriate layout of the interconnect elements.

FIG. 6B depicts the IC 600 at a stage of fabrication or deprocess in which the cathode contacts 616 are exposed for probing. The probing method described in reference to FIG. 6A may be performed on the IC 600 in the configuration depicted in FIG. 6B as well. This procedure is advantageous for monitoring ICs at an earlier stage of fabrication.

What is claimed is:

1. A serpentine double gated diode array, comprising:
a plurality of cathode active areas formed in a substrate;
a serpentine gate structure formed over top surfaces of said cathode active areas, such that:
adjacent segment pairs of said serpentine gate structure are separated by less than 400 nanometers; and
said adjacent segment pairs of said serpentine gate structure are joined in loops which are less than 300 nanometers distant from said cathode active areas;
a plurality of n-type source/drain regions formed in said cathode active areas adjacent to said adjacent segment pairs of said serpentine gate structure; and
a plurality of substrate contact regions in said substrate adjacent to said cathode active areas.

2. The serpentine double gated diode array of claim 1, further comprising:
a second plurality of cathode active areas formed in said substrate;
a second serpentine gate structure formed over top surfaces of said second plurality of cathode active areas, such that:
adjacent segment pairs of said second serpentine gate structure are separated by more than 400 nanometers; and
said adjacent segment pairs of said second serpentine gate structure are joined in loops which are an equal distance from said second plurality of cathode active areas as said loops of said first serpentine gate structure are from said first plurality of cathode active areas;
and
a second plurality of n-type source/drain regions formed in said second plurality of cathode active areas adjacent to said adjacent segment pairs of said second serpentine gate structure.

3. The serpentine double gated diode array of claim 1, further comprising:
a second plurality of cathode active areas formed in said substrate;
a second serpentine gate structure formed over top surfaces of said second plurality of cathode active areas, such that:
adjacent segment pairs of said second serpentine gate structure are separated by a distance equal to a separation of said adjacent segment pairs of said first serpentine gate structure; and
said adjacent segment pairs of said second serpentine gate structure are joined in loops which are more than 300 nanometers distant from said second plurality of cathode active areas;
and
a second plurality of n-type source/drain regions formed in said second plurality of cathode active areas adjacent to said adjacent segment pairs of said second serpentine gate structure.

4. The serpentine double gated diode array of claim 1, further comprising:
a second plurality of cathode active areas formed in said substrate;
a second serpentine gate structure formed over top surfaces of said second plurality of cathode active areas, such that:
adjacent segment pairs of said second serpentine gate structure are separated by a distance equal to a separation of said adjacent segment pairs of said first serpentine gate structure;
said adjacent segment pairs of said second serpentine gate structure are joined in loops which are an equal distance from said second plurality of cathode active areas as said loops of said first serpentine gate structure are from said first plurality of cathode active areas; and
a gate length of said second serpentine gate structure is substantially 50 percent more than a gate length of said first serpentine gate structure;
and
a second plurality of n-type source/drain regions formed in said second plurality of cathode active areas adjacent to said adjacent segment pairs of said second serpentine gate structure.

5. The serpentine double gated diode array of claim 1, further comprising cathode contacts formed on top surfaces of said n-type source/drain regions such that top surfaces of said cathode contacts are exposed.

6. An integrated circuit, comprising:
an n-channel metal oxide semiconductor (NMOS) transistor, in which a channel region is under tensile stress greater than 1000 MPa;
a serpentine double gated diode array, further comprising:
 a plurality of cathode active areas formed in a substrate;
 a serpentine gate structure formed over top surfaces of said cathode active areas, such that:
  adjacent segment pairs of said serpentine gate structure are separated by less than 400 nanometers; and
  said adjacent segment pairs of said serpentine gate structure are joined in loops which are less than 300 nanometers distant from said cathode active areas;
 a plurality of n-type source/drain regions formed in said cathode active areas adjacent to said adjacent segment pairs of said serpentine gate structure; and
 a plurality of substrate contact regions in said substrate adjacent to said cathode active areas.

7. The integrated circuit of claim 6, in which said serpentine double gated diode array further comprises:
 a second plurality of cathode active areas formed in said substrate;
 a second serpentine gate structure formed over top surfaces of said second plurality of cathode active areas, such that:
  adjacent segment pairs of said second serpentine gate structure are separated by more than 400 nanometers; and
  said adjacent segment pairs of said second serpentine gate structure are joined in loops which are an equal distance from said second plurality of cathode active areas as said loops of said first serpentine gate structure are from said first plurality of cathode active areas;
 and
 a second plurality of n-type source/drain regions formed in said second plurality of cathode active areas adjacent to said adjacent segment pairs of said second serpentine gate structure.

8. The integrated circuit of claim 6, in which said serpentine double gated diode array further comprises:
 a second plurality of cathode active areas formed in said substrate;
 a second serpentine gate structure formed over top surfaces of said second plurality of cathode active areas, such that:
  adjacent segment pairs of said second serpentine gate structure are separated by a distance equal to a separation of said adjacent segment pairs of said first serpentine gate structure; and
  said adjacent segment pairs of said second serpentine gate structure are joined in loops which are more than 300 nanometers distant from said second plurality of cathode active areas;
 and
 a second plurality of n-type source/drain regions formed in said second plurality of cathode active areas adjacent to said adjacent segment pairs of said second serpentine gate structure.

9. The integrated circuit of claim 6, in which said serpentine double gated diode array further comprises:
 a second plurality of cathode active areas formed in said substrate;
 a second serpentine gate structure formed over top surfaces of said second plurality of cathode active areas, such that:
  adjacent segment pairs of said second serpentine gate structure are separated by a distance equal to a separation of said adjacent segment pairs of said first serpentine gate structure;
  said adjacent segment pairs of said second serpentine gate structure are joined in loops which are an equal distance from said second plurality of cathode active areas as said loops of said first serpentine gate structure are from said first plurality of cathode active areas; and
  a gate length of said second serpentine gate structure is substantially 50 percent more than a gate length of said first serpentine gate structure;
 and
 a second plurality of n-type source/drain regions formed in said second plurality of cathode active areas adjacent to said adjacent segment pairs of said second serpentine gate structure.

10. The integrated circuit of claim 9, in which said serpentine double gated diode array further comprises cathode contacts formed on top surfaces of said n-type source/drain regions such that top surfaces of said cathode contacts are exposed.

11. A method of forming an integrated circuit, comprising the steps of:
 forming a first integrated circuit comprising:
  an NMOS transistor, in which a channel region is under tensile stress greater than 1000 MPa;
  a serpentine double gated diode array, further comprising:
   a plurality of cathode active areas formed in a substrate of said integrated circuit;
   a serpentine gate structure formed over top surfaces of said cathode active areas, such that:
    adjacent segment pairs of said serpentine gate structure are separated by less than 400 nanometers; and
    said adjacent segment pairs of said serpentine gate structure are joined in loops which are less than 300 nanometers distant from said cathode active areas;
   a plurality of n-type source/drain regions formed in said cathode active areas adjacent to said adjacent segment pairs of said serpentine gate structure; and
   a plurality of substrate contact regions in said substrate adjacent to said cathode active areas;
 electrically testing said serpentine double gated diode array; and
 estimating a density of stress induced defects from said step of electrically testing said serpentine double gated diode array.

12. The method of claim 11, further comprising the step of forming a second integrated circuit comprising a second NMOS transistor in which a second channel region is under a different tensile stress level than said first channel region.

13. The method of claim 12, in which said first integrated circuit further comprises a second serpentine double gated diode array, further comprising:
 a second plurality of cathode active areas formed in said substrate;
 a second serpentine gate structure formed over top surfaces of said second plurality of cathode active areas, such that:
  adjacent segment pairs of said second serpentine gate structure are separated by more than 400 nanometers; and said adjacent segment pairs of said second serpentine gate structure are joined in loops which are an equal distance from said second plurality of cathode active areas as said loops of said first serpentine gate structure are from said first plurality of cathode active areas; and a second plurality of n-type source/drain regions formed in said second plurality of cathode active areas adjacent to said adjacent segment pairs of said second serpentine gate structure;

and further comprising the steps of:

electrically testing said second serpentine double gated diode array;

estimating a second density of stress induced defects from said step of electrically testing said second serpentine double gated diode array; and forming said second integrated circuit in which a separation distance of adjacent segment pairs of NMOS gates is different from a separation distance of adjacent segment pairs of NMOS gates in said first integrated circuit.

14. The method of claim 12, in which said first integrated circuit further comprises a second serpentine double gated diode array, further comprising:

a second plurality of cathode active areas formed in said substrate;

a second serpentine gate structure formed over top surfaces of said second plurality of cathode active areas, such that:

adjacent segment pairs of said second serpentine gate structure are separated by a distance equal to a separation of said adjacent segment pairs of said first serpentine gate structure; and said adjacent segment pairs of said second serpentine gate structure are joined in loops which are more than 300 nanometers distant from said second plurality of cathode active areas; and a second plurality of n-type source/drain regions formed in said second plurality of cathode active areas adjacent to said adjacent segment pairs of said second serpentine gate structure;

and further comprising the steps of:

electrically testing said second serpentine double gated diode array;

estimating a second density of stress induced defects from said step of electrically testing said second serpentine double gated diode array; and forming said second integrated circuit in which a distance of NMOS gate loops from NMOS active areas is different from a distance of NMOS gate loops from NMOS active areas in said first integrated circuit.

15. The method of claim 12, in which said first integrated circuit further comprises a second serpentine double gated diode array, further comprising:

a second plurality of cathode active areas formed in said substrate;

a second serpentine gate structure formed over top surfaces of said second plurality of cathode active areas, such that:

adjacent segment pairs of said second serpentine gate structure are separated by a distance equal to a separation of said adjacent segment pairs of said first serpentine gate structure;

said adjacent segment pairs of said second serpentine gate structure are joined in loops which are an equal distance from said second plurality of cathode active areas as said loops of said first serpentine gate structure are from said first plurality of cathode active areas; and a gate length of said second serpentine gate structure is substantially 50 percent more than a gate length of said first serpentine gate structure; and a second plurality of n-type source/drain regions formed in said second plurality of cathode active areas adjacent to said adjacent segment pairs of said second serpentine gate structure;

and further comprising the steps of:

electrically testing said second serpentine double gated diode array;

estimating a second density of stress induced defects from said step of electrically testing said second serpentine double gated diode array; and forming said second integrated circuit in which a gate length of a second NMOS transistor is different from a gate length of said first NMOS transistor.

16. The method of claim 12, further comprising the steps of:

forming cathode contacts on top surfaces of said n-type source/drain regions such that top surfaces of said cathode contacts are exposed;

probing said serpentine double gated diode array using scanning capacitance microscopy (SCM) on said exposed top surfaces of said cathode contacts such that instances of said n-type source/drain regions with stress induced defects are identified;

forming a third integrated circuit in which n-type source/drain regions are formed with a different process than said first plurality of n-type source/drain regions in said first integrated circuit.

17. The method of claim 12, further comprising the steps of:

forming cathode contacts on top surfaces of said n-type source/drain regions;

forming a first set of metal interconnects on top surfaces of said cathode contacts so as to make electrical connections to said cathode contacts;

forming a second set of metal interconnects on top surfaces of said first set of metal interconnects so as to make electrical connections to said first set of metal interconnects;

removing said second set of metal interconnects;

probing said serpentine double gated diode array using SCM on said exposed top surfaces of said first set of metal interconnects such that instances of said n-type source/drain regions with stress induced defects are identified;

forming a third integrated circuit in which n-type source/drain regions are formed with a different process than said first plurality of n-type source/drain regions in said first integrated circuit.

18. The method of claim 12, further comprising the steps of:

forming cathode contacts on top surfaces of said n-type source/drain regions such that top surfaces of said cathode contacts are exposed;

probing said serpentine double gated diode array using scanning spreading resistance microscopy (SSRM) on said exposed top surfaces of said cathode contacts such that instances of said n-type source/drain regions with stress induced defects are identified;

forming a third integrated circuit in which n-type source/drain regions are formed with a different process than said first plurality of n-type source/drain regions in said first integrated circuit.

19. The method of claim 12, further comprising the steps of:

forming cathode contacts on top surfaces of said n-type source/drain regions;

forming a first set of metal interconnects on top surfaces of said cathode contacts so as to make electrical connections to said cathode contacts;

forming a second set of metal interconnects on top surfaces of said first set of metal interconnects so as to make electrical connections to said first set of metal interconnects;

removing said second set of metal interconnects;

probing said serpentine double gated diode array using SSRM on said exposed top surfaces of said first set of metal interconnects such that instances of said n-type source/drain regions with stress induced defects are identified;

forming a third integrated circuit in which n-type source/drain regions are formed with a different process than said first plurality of n-type source/drain regions in said first integrated circuit.

* * * * *